(12) United States Patent
Wu et al.

(10) Patent No.: US 7,781,264 B2
(45) Date of Patent: Aug. 24, 2010

(54) METHOD FOR FABRICATING FLIP-CHIP SEMICONDUCTOR PACKAGE WITH LEAD FRAME AS CHIP CARRIER

(75) Inventors: Chi-Chuan Wu, Taichung Hsien (TW); Chien-Ping Huang, Hsinchu Hsein (TW); Han-Ping Pu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 444 days.

(21) Appl. No.: 11/891,926

(22) Filed: Aug. 14, 2007

(65) Prior Publication Data
US 2007/0284710 A1 Dec. 13, 2007

Related U.S. Application Data

(62) Division of application No. 10/196,305, filed on Jul. 16, 2002, now Pat. No. 7,274,088.

(30) Foreign Application Priority Data
Jun. 14, 2002 (TW) ............................... 91112996 A

(51) Int. Cl.
*H01L 21/44* (2006.01)
*H01L 21/48* (2006.01)
(52) U.S. Cl. ................. 438/123; 257/E23.031
(58) Field of Classification Search ................. 438/123; 257/666, E23.031
See application file for complete search history.

(56) References Cited

U.S. PATENT DOCUMENTS

| | | | |
|---|---|---|---|
| 5,331,235 A | 7/1994 | Chun | |
| 5,648,682 A * | 7/1997 | Nakazawa et al. | 257/673 |
| 5,714,405 A | 2/1998 | Tsubosaki et al. | |
| 5,821,611 A * | 10/1998 | Kubota et al. | 257/673 |
| 5,926,694 A | 7/1999 | Chigawa et al. | |
| 5,989,474 A | 11/1999 | Suzuki | |
| 6,131,795 A | 10/2000 | Sato | |
| 6,184,573 B1 | 2/2001 | Pu | |
| 6,249,041 B1 * | 6/2001 | Kasem et al. | 257/666 |
| 6,338,336 B1 * | 1/2002 | Iida | 123/674 |

(Continued)

OTHER PUBLICATIONS

C. Harper, Ed., Electronic Packaging and Interconnection Handbook, Third Edition, McGraw-Hill, 2000.

*Primary Examiner*—Nitin Parekh
(74) *Attorney, Agent, or Firm*—Edwards Angell Palmer & Dodge LLP; Peter F. Corless; Steven M. Jensen

(57) ABSTRACT

A flip-ship semiconductor package with a lead frame as a chip carrier is provided, wherein a plurality of leads of the lead frame are each formed with at least a dam member thereon. When a chip is mounted on the lead frame by means of solder bumps, each of the solder bumps is attached to the corresponding one of the leads at a position between the dam member and an inner end of the lead. During a reflow-soldering process for wetting the solder bumps to the leads, the dam members would help control collapse height of the solder bumps, so as to enhance resistance of the solder bumps to thermal stress generated by CTE (coefficient of thermal expansion) mismatch between the chip and the leads, thereby preventing incomplete electrical connection between the chip and the leads.

7 Claims, 6 Drawing Sheets

U.S. PATENT DOCUMENTS 6,486,539 B1 * 11/2002 Tandy .................. 257/669
6,504,238 B2 * 1/2003 Cheng et al. ............ 257/676

2002/0182773 A1 12/2002 Su et al.

* cited by examiner

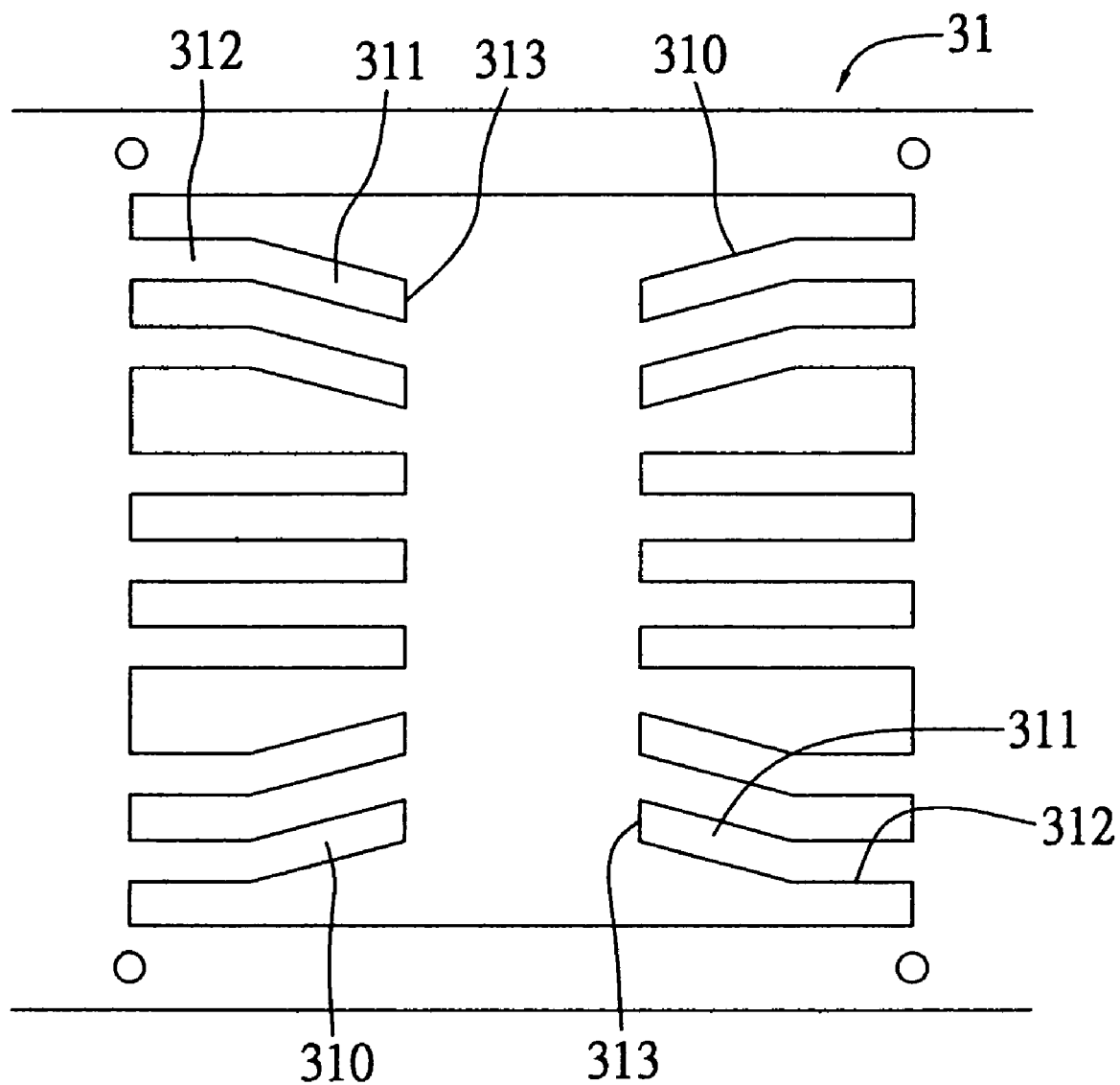

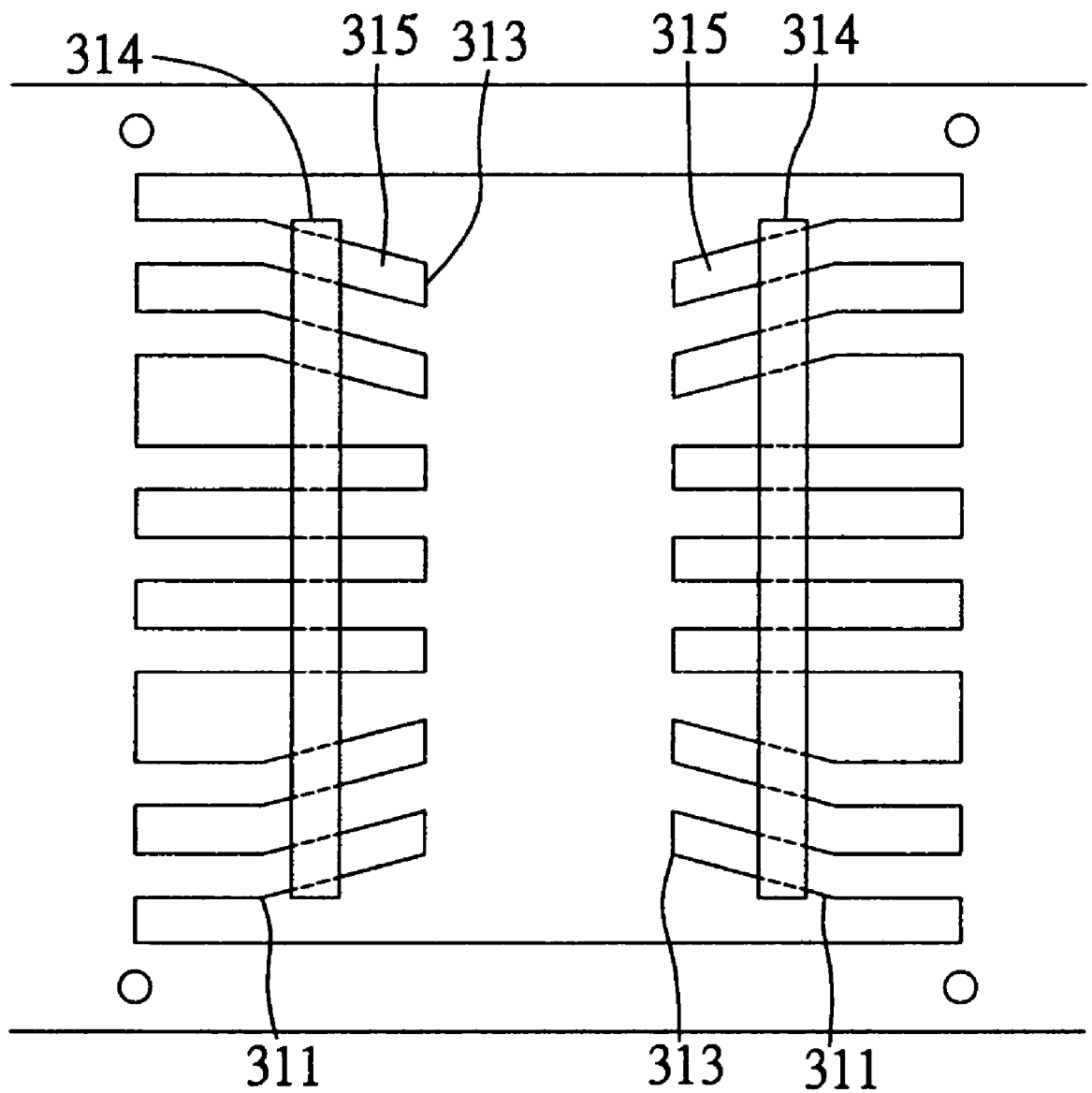

METHOD FOR FABRICATING FLIP-CHIP SEMICONDUCTOR PACKAGE WITH LEAD FRAME AS CHIP CARRIER

CROSS-REFERENCE TO RELATED APPLICATION(S)

This application is a divisional of copending application U.S. Ser. No. 10/196,305, filed on Jul. 16, 2002.

FIELD OF THE INVENTION

The present invention relates to semiconductor packages and fabrication methods thereof, and more particularly, to a flip-chip semiconductor package with a lead frame as a chip carrier, and a method for fabricating the flip-chip semiconductor package.

BACKGROUND OF THE INVENTION

In a lead-frame-based semiconductor package, a chip is mounted on a die pad of the lead frame, and electrically connected to leads of the lead frame by means of a plurality of bonding wires; alternatively, the chip can be mounted on and wire-bonded to the leads without having to form a die pad for the lead frame. Wire-bonding technology, however, induces several problems. Relatively long bonding wires may be unfavorable to quality of electrical connection between the chip and the lead frame; during a molding process for chip encapsulation, the bonding wires are subject to mold-flow impact that may easily cause wire sweeping or sagging, making adjacent bonding wires undesirably come into contact with each other and short-circuited. Moreover, the semiconductor package needs to be dimensioned for comfortably accommodating loop height of the bonding wires, such that overall package height is hard to be effectively reduced thereby not in favor of profile miniaturization.

Flip-chip semiconductor packages adopts an advanced package technology for facilitating profile miniaturization and high integration and performances. A flip-chip semiconductor package is characterized by mounting a chip on a chip carrier such as a substrate in a flip-chip manner, wherein an active surface, where electronic components or circuits are formed, of the chip faces toward the chip carrier and is electrically connected to the chip carrier by solder bumps interposed between the active surface of the chip and the chip carrier. Such an electrical-connection method is more beneficial than wire-bonding technology without concerning the above-mentioned problems generated in the use of bonding wires. However, as the solder bumps are usually made of soft metal such as tin 63/lead 37 alloy having a low melting point, during a reflow-soldering process, the solder bumps may over-collapse and hardly resist thermal stress generated by CTE (coefficient of thermal expansion) mismatch in materials between the chip and the chip carrier; this thereby undesirably damages electrical connection between the chip and the chip carrier. Moreover, the flip-chip arrangement requires the solder bumps to be precisely bonded to the chip carrier, which thus increases fabrication costs and is normally applied to high-level products, but not suitable for lead-frame-based structures that accommodates DRAM (dynamic random access memory) or SRAM (static random access memory) chips.

Accordingly, U.S. Pat. No. 5,331,235 teaches a flip-chip semiconductor package with a lead frame as a chip carrier. As shown in FIG. 1, in this flip-chip semiconductor package, the lead frame 37 is double-side mounted with two chips 32, 34, wherein the chips 32, 34 are respectively electrically connected to the lead frame 37 by means of solder bumps 33, 35 bonded to a TAB (tape automated bonding) tape 31 for the sake of miniaturization in package profile. However, the use of the TAB tape 31 would undesirably increase fabrication costs, and the solder bumps 33, 35 may still over-collapse to impair electrical connection between the chips 32, 34 and the lead frame 37.

In response to electrical-connection problems, U.S. Pat. No. 6,184,573 discloses a flip-chip semiconductor package having a lead frame being applied with a solder mask. As shown in FIG. 2, in this flip-chip semiconductor package, the solder mask 26 is applied over leads 27, and formed with a plurality of openings 260 corresponding in position to solder bumps 24, 25 respectively implanted on chips 21, 22 that are to be mounted on the leads 27. During a reflow-soldering process, the solder bumps 24, 25 are wetted to the openings 260 without over-collapsing or over-wetted to other unintended area of the leads 27, so as to assure electrical connection between the chips 21, 22 and the leads 27 by means of the solder bumps 24, 25. However, fabricating processes for coating the solder mask 27 and forming the openings 260 are relatively complex and cost-ineffective to implement.

Therefore, the problem to be solved is to provide a flip-chip semiconductor package, which can be cost-effectively fabricated, and allows a chip to be well electrically connected to a chip carrier by means of solder bumps.

SUMMARY OF THE INVENTION

An objective of the present invention is to provide a flip-chip semiconductor package with a lead frame as a chip carrier and a fabrication method thereof, so as to assure quality of electrical connection between the lead frame and a chip mounted on the lead frame.

Another objective of the invention is to provide a flip-chip semiconductor package with a lead frame as a chip carrier and a fabrication method thereof, whereby the flip-chip semiconductor package can be cost-effectively fabricated.

In accordance with the above and other objectives, the present invention proposes a flip-chip semiconductor package with a lead frame as a chip carrier and a fabrication method thereof. The flip-chip semiconductor package comprises: a lead frame having a plurality of leads, each of the leads being formed with an inner end directed toward the center of the lead frame, wherein a dam member is provided at a predetermined position on each of the leads, so as to form a bonding area between the dam member and the inner end of the corresponding one of the leads; at least a chip implanted with a plurality of solder bumps and mounted on the lead frame in a manner that, the solder bumps are bonded to the bonding areas of the leads, so as to allow the chip to be electrically connected to the leads by the solder bumps; and an encapsulant for encapsulating the chip, the solder bumps and part of the leads.

The fabrication method of the above flip-chip semiconductor package comprises the steps of: preparing a lead frame having a plurality of leads, each of the leads being formed with an inner end directed toward the center of the lead frame; attaching a dam member to a predetermined position on each of the leads, so as to form a bonding area between the dam member and the inner end of the corresponding one of the leads; preparing at least a chip implanted with a plurality of solder bumps, and mounting the chip on the lead frame in a manner that, the solder bumps are bonded to the bonding areas of the leads, so as to allow the chip to be electrically connected to the leads by the solder bumps; and forming an encapsulant for encapsulating the chip, the solder bumps and part of the leads.

The dam member can be a polyimide tape, or made of a solder mask printed on the lead. With provision of the dam members, during a reflow-soldering process, the solder bumps would collapse to be of a height corresponding to thickness of the dam member and thus completely received between the chip and the leads without over-collapsing or over-wetted to contaminate other unintended area of the leads, so as to assure quality of electrical connection between the chip and the lead frame by means of the solder bumps.

Moreover, the solder bumps can be made of conventional eutectic alloy without having to use relatively expensive solder material with high content of lead. And, conventional complex processes for applying a solder mask over leads and forming openings through the solder mask are not necessarily performed. Therefore, the above flip-chip semiconductor package according to the invention can be cost-effectively fabricated.

For further enhancing bonding strength between the solder bumps and the leads, bonding areas formed between the dam members and the inner ends of the leads can be respectively formed with recessed portions or protruding portions, so as to increase contact surface area of the bonding areas for bonding or wetting the solder bumps thereto.

BRIEF DESCRIPTION OF THE DRAWINGS

The present invention can be more fully understood by reading the following detailed description of the preferred embodiments, with reference made to the accompanying drawings, wherein:

FIGS. 4A-4D are cross-sectional schematic diagrams showing process steps for fabricating the semiconductor package according to the first preferred embodiment of the invention;

DETAILED DESCRIPTION OF THE PREFERRED EMBODIMENTS

First Preferred Embodiment

Figure 1:
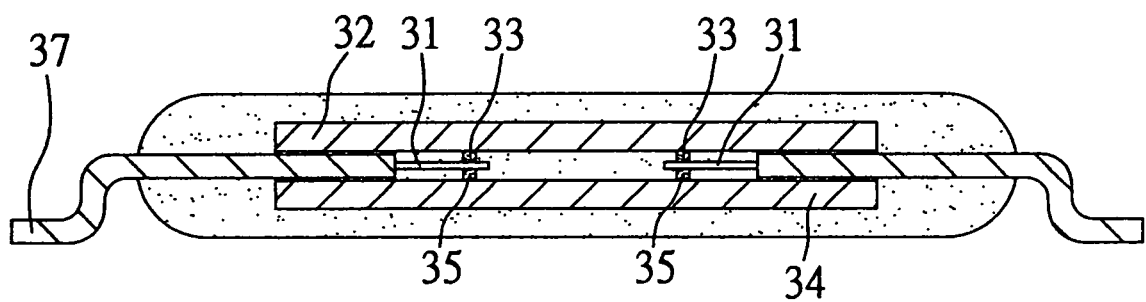
FIG. 1 (PRIOR ART) is a cross-sectional view of a conventional flip-chip semiconductor package with a lead frame as a chip carrier.
Figure 2:
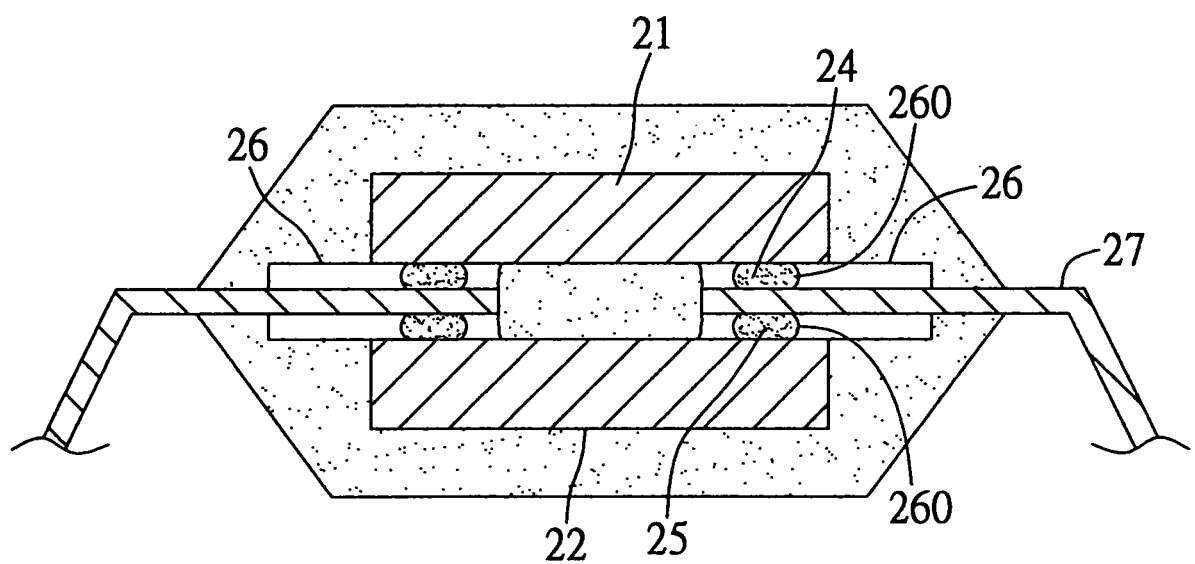
FIG. 2 (PRIOR ART) is a cross-sectional view of another conventional flip-chip semiconductor package with a lead frame as a chip carrier.
Figure 3:
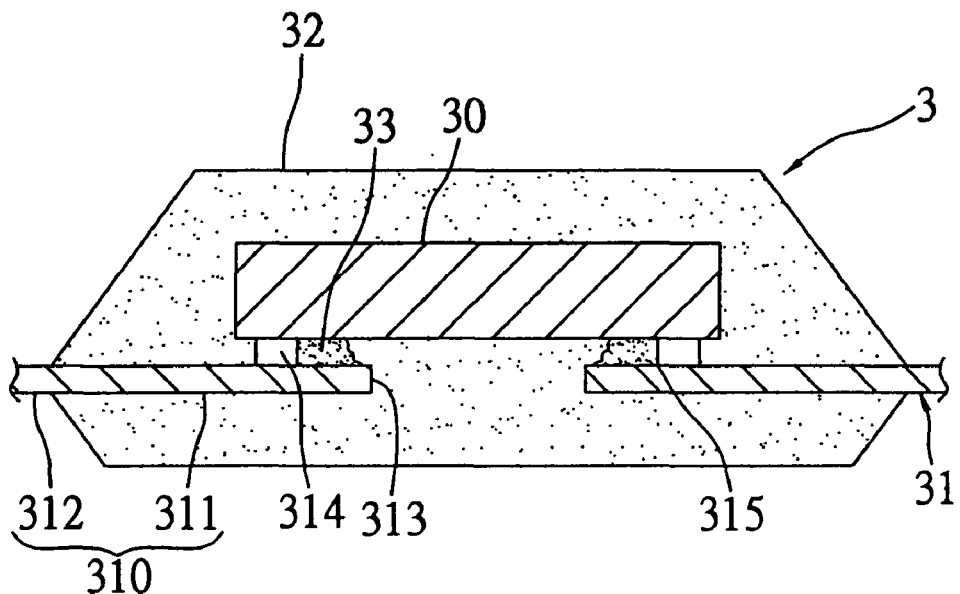
FIG. 3 is a cross-sectional view of a semiconductor package according to a first preferred embodiment of the invention.

FIG. 3 illustrates a flip-chip semiconductor package with a lead frame as a chip carrier according to a first preferred embodiment of the present invention.

As shown in FIG. 3, the semiconductor package 3 is mainly composed of a chip 30, a lead frame 31 for accommodating the chip 30, and an encapsulant 32 for encapsulating the chip 30 and part of the lead frame 31.

The chip 30 is bonded with a plurality of solder bumps 33 on an active surface thereof where electronic components and electronic circuits are formed. This allows the chip 30 to be mounted on and electrically connected to the lead frame 31 by means of the solder bumps 33, so as to form a flip-chip structure.

The lead frame 31 has a plurality of leads 310, and each of the leads 310 is composed of an inner lead 311 and an outer lead 312, wherein the inner leads 311 are encapsulated by the encapsulant 32, and the outer leads 312 are exposed to outside of the encapsulant 32. The leads 310 are arranged in a manner as to properly space apart ends 313 of the inner leads 311 from each other. On a surface, mounted with the chip 30, of each of the inner leads 311 there is attached a polyimide tape 314 at a predetermined position close to the end 313 of the corresponding one of the inner leads 311, whereby a bonding area 315 is formed between the end 313 and the polyimide tape 314 on each of the inner leads 311. This allows the solder bumps 33 on the chip 30 to be respectively reflow-soldered to the bonding areas 315 of the inner leads 311, such that the chip 30 can be electrically connected to the leads 310 of the lead frame 31 by means of the solder bumps 33. During the reflow-soldering process, with provision of the polyimide tapes 314, the solder bumps 33 would be only wetted to the bonding areas 315 without being over-wetted to contaminate other unintended area of the inner leads 311, thereby assuring bonding quality between the solder bumps 33 and the inner leads 311. Moreover, the polyimide tapes 314 are formed with a predetermined height corresponding to a collapsed height of the solder bumps 33 in a manner that, the solder bumps 33 after collapse can be completely received between the chip 30 and the inner leads 311 without over-collapsing to degrade quality of electrical connection between the chip 30 and the leads 310. Such a structure with the solder bumps 33 being firmly interposed between the chip 30 and the inner leads 311, would help enhance resistance of the solder bumps 33 to thermal stress generated by CTE (coefficient of thermal expansion) mismatch in materials between the chip 30 and the lead frame 31, thereby further assuring quality of electrical connection between the chip 30 and the leads 310 of the lead frame 31.

It should be understood that, the polyimide tapes 314 used as dam members for preventing over-wetting and over-collapse of the solder bumps 33, can be replaced by using a solder mask or other suitable material such as resin material to be applied or printed at suitable positions on the inner leads 311.

Moreover, the solder bumps 33 can be made of conventional eutectic alloy without having to use relatively expensive solder material with high content of lead. And, conventional complex processes for applying a solder mask over leads and forming openings through the solder mask are not necessarily performed. Therefore, the above flip-chip semiconductor package 3 according to the invention can be cost-effectively fabricated.

FIGS. 4A-4D illustrate process steps for fabricating the above semiconductor package 3 of the first preferred embodiment.

Referring to FIG. 4A, the first step is to prepare a lead frame 31 having a plurality of leads 310 without a die pad. As shown in the drawing, in this embodiment, the lead frame 31 is of a dual-in-line type for use with a chip having two rows of bond pads; for a chip formed with peripherally-situated bond pads, the lead frame 31 is preferably of a quad flat type. Each of the leads 310 of the lead frame 31 is composed of an inner lead 311 having an end 313, and an outer lead 312.

Figure 4C:
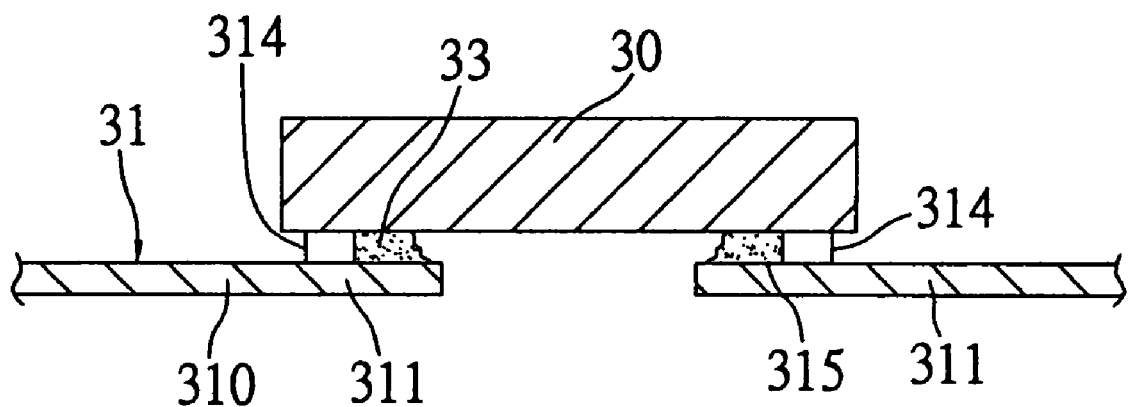

Referring to FIG. 4B, the next step is to attach a polyimide tape 314 to a predetermined position close to the end 313 of each of the inner leads 311, whereby a bonding area 315 is formed between the polyimide tape 314 and the end 313 of the corresponding one of the inner leads 311;

Referring to FIG. 4C, a chip 30 bonded with a plurality of solder bumps 33 is prepared and mounted on the lead frame 31 by attaching the solder bumps 33 respectively to the leads 310, wherein a reflow-soldering process is performed to bond the solder bumps 33 to the bonding areas 315 of the inner leads 311, so as to electrically connect the chip 30 to the leads 310 of the lead frame 31 by means of the solder bumps 33. As described above, with provision of the polyimide tapes 314, the solder bumps 33 would collapse to be wetted only to the bonding areas 315 without over-collapsing or over-wetted to contaminate other unintended area outside the bonding areas 315, such that quality of electrical connection between the chip 30 and the lead frame 31 can be firmly assured.

Figure 4D:
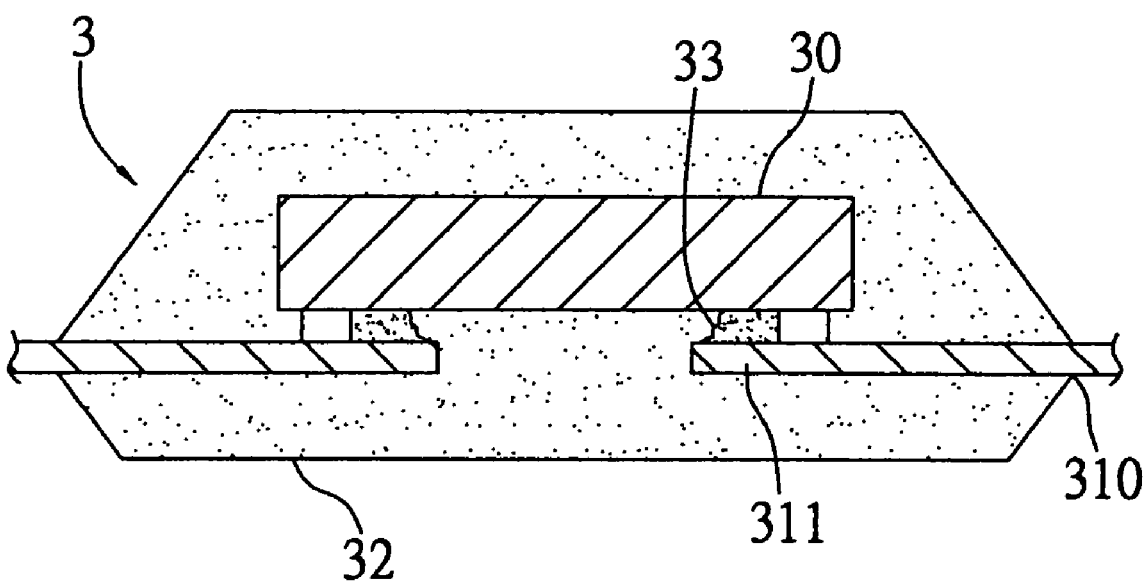

Referring finally to FIG. 4D, after completing the above chip-bonding process, a molding process is performed to form an encapsulant 32 for hermetically encapsulating the chip 30, the solder bumps 33 and the inner leads 311 of the lead frame 31. This thereby prevents external moisture or contaminants from entering into the semiconductor package 3 and from damaging inner components thereof such as the chip 30, solder bumps 33 and so on.

After forming the encapsulant 32, curing, marking, trim/form and singulation processes are carried out to complete fabrication of the semiconductor package 3; as these fabricating processes are conventional in the art, no further description thereof is to be provided herein.

Second Preferred Embodiment

Figure 5:
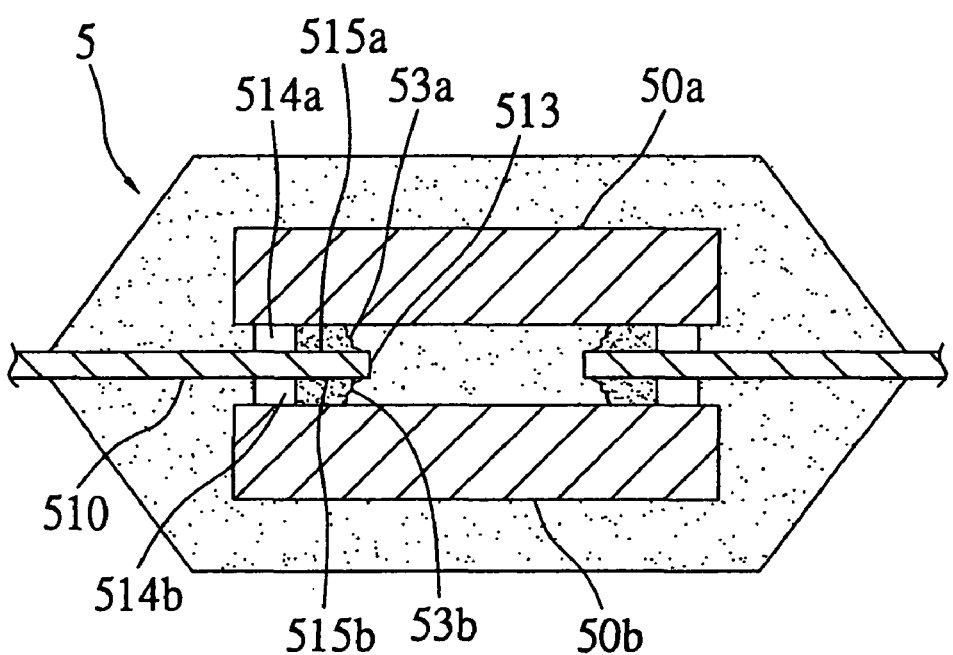
FIG. 5 is a cross-sectional view of a semiconductor package according to a second preferred embodiment of the invention.

FIG. 5 illustrates a semiconductor package 5 according to a second preferred embodiment of the invention. As shown in FIG. 5, this semiconductor package 5 is mostly the same in structure as the semiconductor package 3 of the above first embodiment, with the only difference in that, each lead 510 in the semiconductor package 5 is provided with two polyimide tapes 514a, 514b respectively on an upper and a lower surfaces of the lead 510. This allows an upper and a lower bonding areas 515a, 515b to be respectively formed between an end 513 of the lead 510 and the polyimide tapes 514a, 514b. Thereby, an upper chip 50a can be mounted on the upper surfaces of the plurality of leads 510 by bonding solder bumps 53a formed on an upper chip 50a to the upper bonding areas 515a, and a lower chip 50b can be mounted on the lower surfaces of the leads 510 by bonding solder bumps 53b formed on a lower chip 50b to the lower bonding areas 515b, such that a multi-chip structure of the semiconductor package 5 is thus fabricated.

Third Preferred Embodiment

Figure 6:
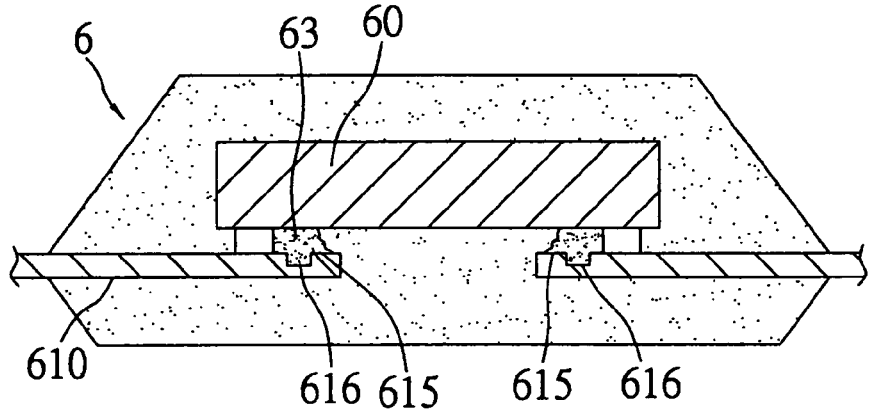
FIG. 6 is a cross-sectional view of a semiconductor package according to a third preferred embodiment of the invention.

FIG. 6 illustrates a semiconductor package 6 according to a third preferred embodiment of the invention. As shown in FIG. 6, this semiconductor package 6 is mostly the same in structure as the semiconductor package 3 of the above first embodiment, with the only difference in that, at least a recessed portion 616 is formed at a bonding area 615 of a lead 610 by conventional punching or etching technique in the semiconductor package 6, so as to increase contact surface area of the bonding area 615 for bonding or wetting a solder bump 63 thereto. Thereby, for mounting the chip 60 to the plurality of leads 610, solder bumps 63 implanted on a chip 60 would be more firmly reflow-soldered and wetted to the bonding areas 615 with the recessed portions 616, and thus bonding strength between the solder bumps 63 and the leads 610 can be effectively enhanced.

The recessed portion 616 can be shaped in cross-section as, but not limited to, a rectangular, arc or conical recess. The recessed portion 616 formed on a single lead 610 is flexible in number thereof, or can be continuously fabricated to make a surface of the bonding area 615 uneven or corrugated.

Fourth Preferred Embodiment

Figure 7:
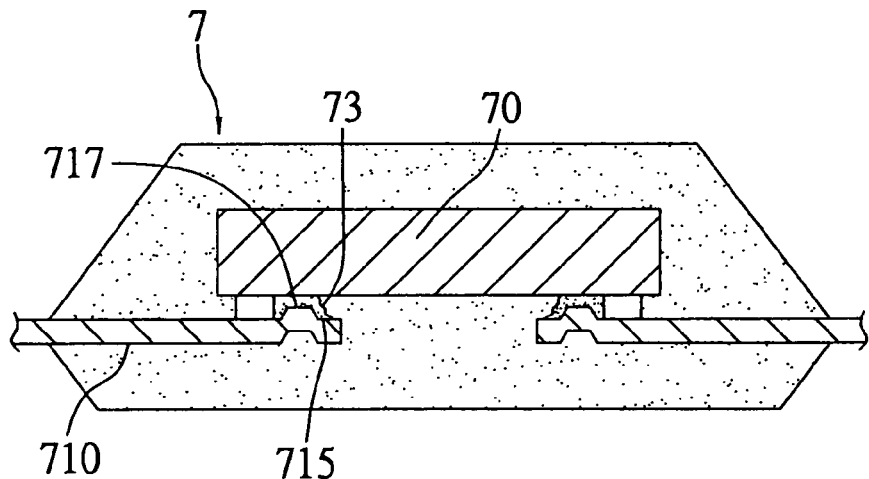
FIG. 7 is a cross-sectional view of a semiconductor package according to a fourth preferred embodiment of the invention.

FIG. 7 illustrates a semiconductor package 7 according to a fourth preferred embodiment of the invention. As shown in FIG. 7, this semiconductor package 7 is mostly the same in structure as the semiconductor package 3 of the above first embodiment, with the only difference in that, at least a protruding portion 717 is formed at a bonding area 715 of a lead 710 by conventional punching or etching technique in the semiconductor package 7. This protruding portion 717 would be inserted into a corresponding one of solder bumps 73 implanted on a chip 70 when the chip 70 is mounted on the plurality of leads 710 and the solder bumps 73 are wetted to the bonding areas 715 of the leads 710, so as to enhance bonding strength between the solder bumps 73 and the protruding portion 717 of the leads 710.

Fifth Preferred Embodiment

Figure 8:
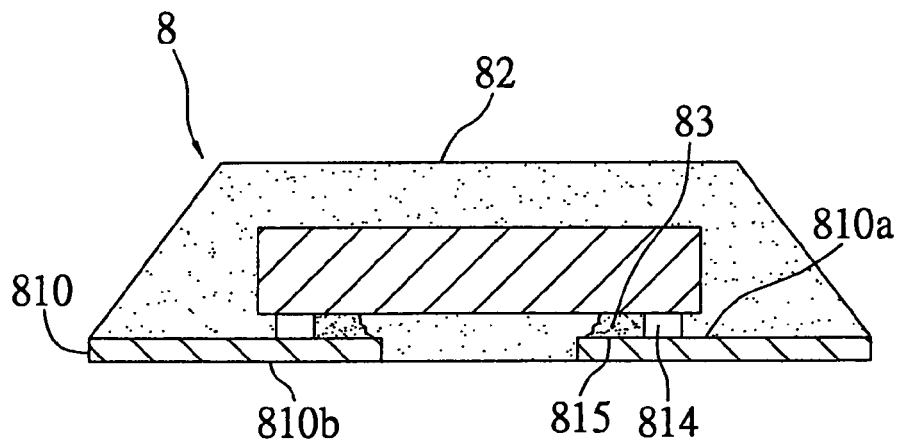
FIG. 8 is a cross-sectional view of a semiconductor package according to a fifth preferred embodiment of the invention.

FIG. 8 illustrates a semiconductor package 8 according to a fourth preferred embodiment of the invention. As shown in FIG. 8, this semiconductor package 8 is mostly the same in structure as the semiconductor package 3 of the above first embodiment, with the only difference in that, the semiconductor package 8 is of a QFN (quad flat non-lead) package structure, wherein bottom surfaces 810b of leads 810 are exposed to outside of an encapsulant 82 for encapsulating a chip 80 and solder bumps 83 mounted on the leads 810, such that the exposed bottom surfaces 810b of the leads 810 can be directly electrically connected to an external device such as a printed circuit board (not shown). On top surfaces 810a of the leads 810 there are respectively attached polyimide tapes 814, so as to form bonding areas 815 where the solder bumps 83 are bonded for electrically connecting the chip 80 to the leads 810.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package, comprising the steps of:
  preparing a lead frame having a plurality of leads, each of the leads being formed with an inner end directed toward the center of the lead frame;
  attaching a dam member to a predetermined position on each of the leads, so as to form a bonding area between the dam member and the inner end of the corresponding one of the leads, wherein the bonding area of each of the leads is formed with at least a recessed portion or a protruding portion;

preparing at least a chip implanted with a plurality of solder bumps, and mounting the chip on the lead frame in a manner that the solder bumps are bonded to the bonding areas of the leads and completely cover the recessed portion or the protruded portion, so as to allow the chip to be electrically connected to the leads by the solder bumps; and forming an encapsulant for hermetically encapsulating the chip and the solder bumps, and encapsulating part of the leads.

2. The fabrication method of claim 1, wherein a portion of the leads is exposed to outside of the encapsulant, and electrically connected to an external device.

3. The fabrication method of claim 1, wherein bottom surfaces of the leads are exposed to outside of the encapsulant, and electrically connected to an external device.

4. The fabrication method of claim 1, wherein the dam member is a polyimide tape.

5. The fabrication method of claim 1, wherein the dam member is made of a resin material printed on the lead.

6. The fabrication method of claim 1, wherein the dam member is made of a solder mask printed on the lead.

7. The fabrication method of claim 1, wherein the solder bumps are reflow-soldered to the bonding areas of the leads.

* * * * *